United States Patent
Kobayashi

(10) Patent No.: US 9,748,467 B2
(45) Date of Patent: Aug. 29, 2017

(54) PIEZOELECTRIC VIBRATOR

(71) Applicant: SII Crystal Technology Inc., Chiba-shi, Chiba (JP)

(72) Inventor: Takashi Kobayashi, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 15/380,251

(22) Filed: Dec. 15, 2016

(65) Prior Publication Data

US 2017/0179366 A1    Jun. 22, 2017

(30) Foreign Application Priority Data

Dec. 16, 2015  (JP) ................. 2015-245083

(51) Int. Cl.
| | | |
|---|---|---|
| *H03H 9/21* | (2006.01) | |
| *H01L 41/053* | (2006.01) | |
| *H01L 41/047* | (2006.01) | |
| *H01L 41/09* | (2006.01) | |

(52) U.S. Cl.
CPC ........ *H01L 41/0533* (2013.01); *H01L 41/047* (2013.01); *H01L 41/094* (2013.01)

(58) Field of Classification Search
CPC .................................. H03H 9/21; H03H 9/215
USPC ........................................................ 310/370
See application file for complete search history.

(56) References Cited

U.S. PATENT DOCUMENTS

| | | | | |
|---|---|---|---|---|
| 2007/0024163 A1* | 2/2007 | Tanaya | ............. | H03H 9/215 310/370 |
| 2008/0211350 A1* | 9/2008 | Tanaya | ............. | H03H 3/04 310/328 |
| 2010/0096953 A1* | 4/2010 | Iwai | ............. | H03H 9/21 310/370 |

(Continued)

FOREIGN PATENT DOCUMENTS

| | | |
|---|---|---|
| JP | 2006-203458 A | 8/2006 |
| JP | 2007096900 A * | 4/2007 |

(Continued)

*Primary Examiner* — J. San Martin
(74) *Attorney, Agent, or Firm* — Brinks Gilson & Lione

(57) ABSTRACT

A piezoelectric vibrator element is more stably bonded to reduce the displacement with respect to an external force. The piezoelectric vibrator element is provided with a pair of vibrating arm parts extending from a base, and support arm parts extending from the base on both outer sides of the vibrating arm parts in parallel thereto. Further, the piezoelectric vibrator element is bonded on a mounting part in the package with the pair of support arm parts to thereby be fixedly held. Two or more bonding regions of each of the support arm parts are disposed in the longitudinal direction. In the longitudinal direction, the bonding region on the base side is disposed on the base side of the centroid of the piezoelectric vibrator element. Thus, the length from the bonding point to the tip of the vibrating arm part can be shortened, and the displacement at the tip of the vibrating arm part can be reduced with respect to an impact from the outside. On the other hand, in order to suppress the vibration leakage from the vibrating arm part, the bonding region located on the base side is disposed on the centroid side of a connection part between the base and the support arm part.

8 Claims, 6 Drawing Sheets

(56) References Cited

U.S. PATENT DOCUMENTS

| | | | | |
|---|---|---|---|---|
| 2011/0068876 A1* | 3/2011 | Yamada | ............... | H03H 9/1021 |
| | | | | 331/158 |
| 2011/0133605 A1* | 6/2011 | Ishikawa | .............. | H03H 9/1021 |
| | | | | 310/344 |
| 2011/0156831 A1* | 6/2011 | Tanaya | ............... | H03H 9/02157 |
| | | | | 331/158 |
| 2014/0292433 A1* | 10/2014 | Yamada | ............... | H03H 9/0547 |
| | | | | 331/156 |
| 2015/0135931 A1 | 5/2015 | Yamada et al. | | |
| 2015/0137902 A1* | 5/2015 | Yamada | ............. | H03H 9/02023 |
| | | | | 331/156 |
| 2016/0028370 A1* | 1/2016 | Nakagawa | ............... | H03H 3/02 |
| | | | | 310/370 |
| 2016/0322935 A1* | 11/2016 | Yamada | .................. | G01L 1/106 |

FOREIGN PATENT DOCUMENTS

| | | | |
|---|---|---|---|
| JP | 2008-022413 A | | 1/2008 |
| JP | 2011-061674 A | | 3/2011 |
| JP | 2012209764 A | * | 10/2012 |
| JP | 2015-097364 A | | 5/2015 |

\* cited by examiner

FIG.4

| PRACTICAL EXAMPLES | TOTAL LENGTH L0 (mm) | L1 | L2 | L3 | L1/L0 | L2/L0 | L3/L0 |
|---|---|---|---|---|---|---|---|
| (1) | 1.38 | 0.34 | 0.59 | 0.44 | 24.60% | 42.80% | 31.90% |
| (2) | 1.1 | 0.23 | 0.43 | 0.43 | 20.90% | 39.10% | 39.10% |
| (3) | 0.907 | 0.207 | 0.32 | 0.38 | 22.80% | 35.30% | 41.90% |

PIEZOELECTRIC VIBRATOR

RELATED APPLICATIONS

This application claims priority under 35 U.S.C. §119 to Japanese Patent Application No. 2015-245083 filed on Dec. 16, 2015, the entire content of which is hereby incorporated by reference.

BACKGROUND OF THE INVENTION

1. Field of the Invention

The present invention relates to a piezoelectric vibrator, and specifically relates to a piezoelectric vibrator having a piezoelectric vibrator element bonded to a casing with support arm parts.

2. Description of the Related Art

For example, in the electronic apparatus such as a cellular phone or a portable information terminal, there is used a piezoelectric vibrator using a quartz crystal or the like as a device used for a clock time source, a timing source for a control signal and so on, a reference signal source, and so on.

As a piezoelectric vibrator of this kind, there has been known a device having a piezoelectric vibrator element hermetically encapsulated in a cavity formed of a package and a lid member as shown in JP-A-2004-297198.

FIGS. 5A through 5F are diagrams showing a structure of a piezoelectric vibrator element 600 of related art.

As shown in FIGS. 5A and 5B, the piezoelectric vibrator element 600 is provided with a base 800 formed of a piezoelectric material and having a predetermined length, and a pair of vibrating arms 700a, 700b extending side by side from the base 800, and at the same time is provided with a pair of fixing arms 900a, 900b extending side by side on the outer side of the vibrating arms 700a, 700b from the both side ends of the base 800.

Further, the piezoelectric vibrator element 600 is fixed by bonding the fixing arms 900a, 900b to an electrode part 1400 provided to the package 200 with electrically-conductive adhesive members 500a, 500b on an imaginary centroidal line passing through the centroid G of the piezoelectric vibrator element 600.

FIGS. 5C through 5F schematically show the displacement in the length direction of the piezoelectric vibrator element with respect to an external force (an external impact) in the case of assuming the fixation place of the piezoelectric vibrator element as a fixed point P.

FIG. 5C shows the piezoelectric vibrator element of the related art in which the piezoelectric vibrator element is fixed (cantilevered) in the base. Since the tip of each of the vibrating arms 700a, 700b is far from the fixed point P, the displacement with respect to the external force is as strong as M1.

In contrast, in the case of the piezoelectric vibrator element 600 shown in FIGS. 5A and 5B, since the fixing arms 900a, 900b are fixed on the centroidal line, by displacing the base side and the tip side in the vertical direction centered on the fixed point P as much as M2 as shown in FIG. 5D, the total displacement M2 becomes smaller compared to M1, which is the displacement of the case of the cantilever structure, and thus, the piezoelectric vibrator element is effectively prevented from colliding with the inside of package 200 to be damaged according to the related art document mentioned above.

However, in reality, as shown in FIG. 5E, the fixed point P is not fixed in the central portion of the vibrating arm 700, but is fixed in the fixing arm 900 via the base 800.

Therefore, as shown in FIG. 5F, only the base 800 side from the fixed point P is displaced as much as M2 similarly to the extended state of a spring, and further, the vibrating arm 700 is displaced as much as M3 pivoted on the base 800 similarly to the case of the cantilever structure. Therefore, since the displacement of M2+M3 occurs at the tip of the vibrating arm 700, it is not necessarily possible to realize the displacement smaller than the displacement M1 of the case of the cantilever structure.

Further, as shown in FIG. 5A, in the piezoelectric vibrator element of the related art, each of the fixing arms 900a, 900b is fixed at one place.

Therefore, since the stress applied to the bonding region becomes high due to the large displacement with respect to the external force as described above, there is a possibility that the bonding region is damaged.

Further, in the case of bonding the fixing arms 900a, 900b, there is a possibility that the piezoelectric vibrator element 600 is tilted in the case of mounting the piezoelectric vibrator element 600 on the soft electrically-conductive adhesive members 500a, 500b, which have not yet cured.

The demand for reducing the displacement of the tip of the vibrating arm and the tilt of the piezoelectric vibrator element with respect to the external force increases as the piezoelectric vibrator is miniaturized so as to have the total length equal to or shorter than 5 mm. In particular, in the case of the size equal to or smaller than 3 mm, it results that the slight increase in displacement and the slight tilt significantly affect the performance of the product and the fabrication yield.

SUMMARY OF THE INVENTION

An object of the invention is to more stably bonding the piezoelectric vibrator element to a mounting part of a package, and at the same time, to reduce the displacement of the entire piezoelectric vibrator with respect to an external force.

(1) According to a first aspect of the invention, there is provided a piezoelectric vibrator including a piezoelectric vibrator element having a base, a pair of vibrating arm parts extending side by side from the base, and a pair of support arm parts arranged on outer sides of the vibrating arm parts and extending from the base, and a package provided with a mounting part on which the support arm parts are mounted via bonding members, wherein each of the support arm parts is bonded to the mounting part at two places separated from each other in a length direction of the support arm parts via first one of the bonding members and second one of the bonding members, respectively, and the first one of the bonding members is disposed on the base side of an imaginary centroidal line passing through a centroid of the piezoelectric vibrator element and extending in a shorter-side direction of the piezoelectric vibrator element.

(2) According to a second aspect of the invention, in the piezoelectric vibrator according to the first aspect of the invention, the first one of the bonding members is disposed on the imaginary centroidal line of a connection part between the base and the support arm part.

(3) According to a third aspect of the invention, in the piezoelectric vibrator according to one of the first and second aspects of the invention, the second one of the bonding members is disposed on a tip side of the support al n part from the imaginary centroidal line.

(4) According to a fourth aspect of the invention, in the piezoelectric vibrator according to any one of the first, second, and third aspects of the invention, the support arm part is one of equal to or longer than ⅓ of a total length of the piezoelectric vibrator element, the first one of the bonding members is disposed in a vicinity of a position distant as much as ⅓ of the total length from an end part of the base, and the second one of the bonding members is disposed in a vicinity of a position distant as much as ⅔ of the total length from the end part of the base.

(5) According to a fifth aspect of the invention, in the piezoelectric vibrator according to any one of the first through fourth aspects of the invention, a distance between centers of the first one of the bonding members and the second one of the bonding members is one of equal to or longer than about ⅓ of the total length of the piezoelectric vibrator element.

According to the invention, since each of the support arm parts is bonded to the mounting part at two places separated from each other in the length direction of the support arm parts via the first one of the bonding members and the second one of the bonding members, and the first one of the bonding members is disposed on the base side of the imaginary centroidal line, it is possible to stably bond the piezoelectric vibrator element to the mounting part of the package, and at the same time, reduce the displacement of the entire piezoelectric vibrator element with respect to the external force.

BRIEF DESCRIPTION OF THE DRAWINGS

FIG. 4 is a diagram showing ratios between the total length L0 of the piezoelectric vibrator element and the sizes of L1, L2, and L3.

DETAILED DESCRIPTION OF THE PREFERRED EMBODIMENTS

Figure 1:
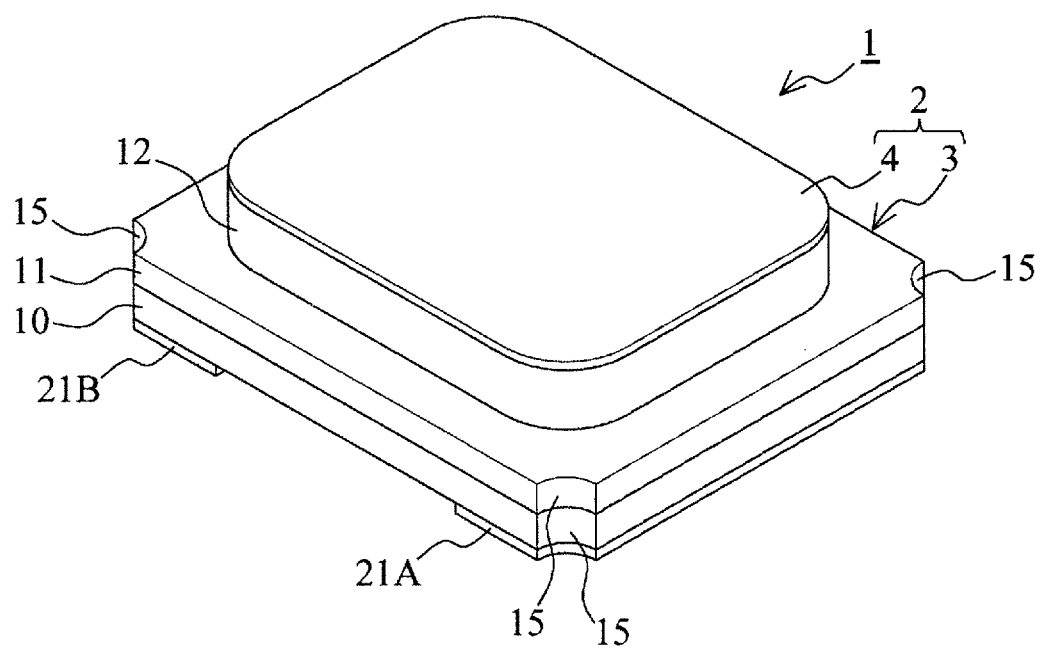
FIG. 1 is an exterior perspective view of a piezoelectric vibrator.

Hereinafter, a preferred embodiment in the piezoelectric vibrator according to the invention will be described in detail with reference to FIG. 1 through FIG. 4.
(1) Outline of Embodiment The piezoelectric vibrator element 6 of the embodiment is provided with a pair of vibrating arm parts 7 (7a, 7b) extending from a base 8, and support arm parts 9 (9a, 9b) extending from the base 8 on both outer sides of the vibrating arm parts 7 in parallel thereto. Further, the piezoelectric vibrator element 6 is bonded on a mounting part 14 in the package with the pair of support arm parts 9 to thereby be fixedly held, and at the same time electrically connected.

Two or more bonding regions are disposed in each of the support arm parts 9 along the longitudinal direction, and preferably two bonding regions are disposed. Further, in the longitudinal direction, among the both bonding regions, the bonding region on the base 8 side is disposed on the base 8 side of the centroid G of the piezoelectric vibrator element 6, and preferably, it is arranged that the centroid G is located between the both bonding regions.

By disposing the bonding region, which is located on the base 8 side, on the base 8 side of the centroid G in the longitudinal direction as described above, the length from the bonding point to the tip of the vibrating arm 7 can be shortened, and the displacement at the tip of the vibrating arm 7 with respect to an impact from the outside can be decreased. On the other hand, in order to suppress the vibration leakage from the vibrating arm part 7, in the longitudinal direction, the bonding region located on the base 8 side is disposed on the centroid G side of a connection part 81 between the base 8 and the support arm part 9.

Further, by providing two or more bonding regions, the junction strength (bonding strength) of the piezoelectric vibrator element 6 increases, and at the same time, the tilt occurring when mounting the piezoelectric vibrator element 6 on the electrically-conductive adhesive, which has not yet cured, can dramatically be reduced compared to the case in which a single bonding region is provided alone. Further, compared to the case of using the electrically-conductive adhesive member on the entire support arm part 9, the amount of the adhesive used is reduced, and it becomes possible to further suppress generation of the gas in the cavity.

Further, the distance between the bonding regions of the support arm parts 9 is made long. For example, the bonding regions are respectively formed in the vicinity of a point distant as much as ⅓ of the total length of the piezoelectric vibrator element 6 from the base 8, and the vicinity of a point distant as much as ⅔ thereof, for example. The distance between the bonding regions is set to roughly ⅓ of the total length. As described above, by elongating the distance between the bonding regions, it becomes possible for the support arm part 9 between the bonding regions to absorb the impact from the outside and the vibration of the support arm part 9 to suppress an influence from the outside and an influence to the outside.

(2) Details of Embodiment

First Embodiment

Figure 2:
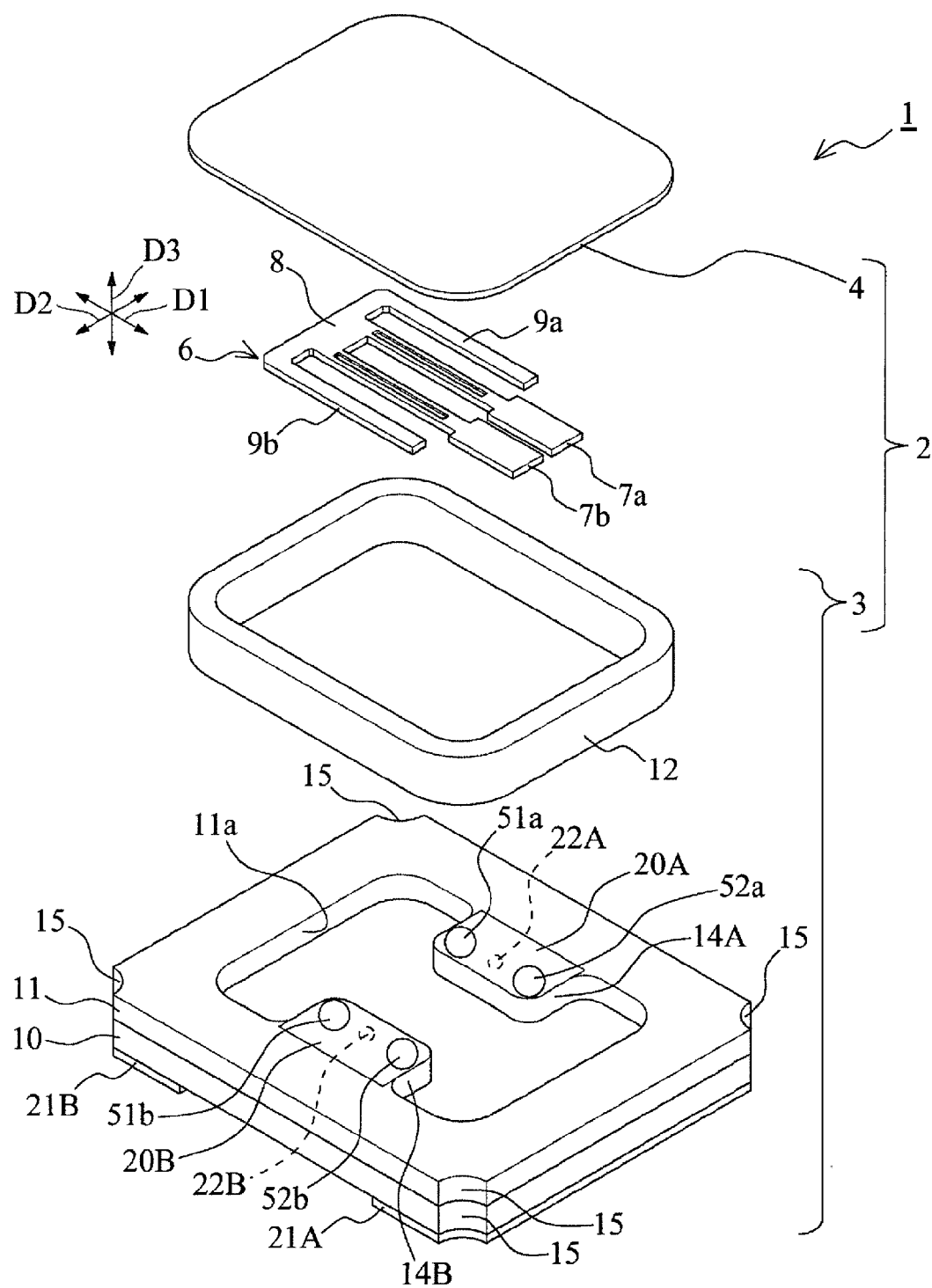
FIG. 2 is an exploded perspective view of the piezoelectric vibrator.

FIG. 1 is an exterior perspective view of the piezoelectric vibrator according to the first embodiment. FIG. 2 is an exploded perspective view of the piezoelectric vibrator according to the first embodiment.

As shown in FIGS. 1 and 2, the piezoelectric vibrator 1 according to the present embodiment is formed as a surface-mounted vibrator of a ceramic package type provided with a package 2 incorporating a cavity C airtightly sealed, and a piezoelectric vibrator element 6 housed in the cavity C.

The piezoelectric vibrator element 6 is a so-called tuning-fork vibrator element formed of a piezoelectric material such as quartz crystal, lithium tantalate, or lithium niobate, and vibrates when a predetermined voltage is applied. In the present embodiment, the description will be presented citing the piezoelectric vibrator element, which is formed using the quartz crystal as the piezoelectric material, as an example.

The piezoelectric vibrator element 6 is provided with the vibrating arm parts 7a, 7b extending in parallel to each other from the base 8, and the support arm parts 9a, 9b extending from the base 8 on the outer sides of the vibrating arm parts 7a, 7b in the same direction, and is held in the cavity C by the support arm parts 9a, 9b. The details of the piezoelectric vibrator element 6 will be described later.

The package 2 is formed to have a roughly rectangular solid shape. The package 2 is provided with a package main body 3, and a sealing plate 4, which is bonded to the package main body 3 to form the cavity C between the sealing plate 4 and the package main body 3.

The package main body 3 is provided with a first base substrate 10 and a second base substrate 11 bonded to each other in the state of being overlapped with each other, and a sealing ring 12 bonded on the second base substrate 11.

On the four corners of each of the first base substrate 10 and the second base substrate 11, cutout parts 15 each having a quarter-arc shape in a planar view are respectively formed throughout the entire substrate in the thickness direction of the both base substrates 10, 11. The first base substrate 10 and the second base substrate 11 are manufactured by bonding two ceramic substrates in, for example, a wafer state so as to overlap each other, then forming a plurality of through holes, which penetrate both of the ceramic substrates and are arranged in a matrix, and subsequently cutting both of the ceramic substrates in a grid manner with reference to the through holes. On this occasion, the cutout parts 15 are formed by dividing the through hole into four parts.

It should be noted that although it is assumed that the first base substrate 10 and the second base substrate 11 are made of ceramic, as the specific ceramic material, there can be cited, for example, HTCC (High Temperature Co-Fired Ceramic) made of alumina, and LTCC (Low Temperature Co-Fired Ceramic) made of glass ceramic.

The upper surface of the first base substrate 10 corresponds to a bottom surface of the cavity C.

The second base substrate 11 is overlapped with the first base substrate 10, and is bonded to the first base substrate 10 by sintering or the like. In other words, the second base substrate 11 is integrated with the first base substrate 10.

It should be noted that as described later, between the first base substrate 10 and the second base substrate 11, there are formed connection electrodes 24A, 24B (not shown) in the state of being sandwiched by the both base substrates 10, 11.

The second base substrate 11 is provided with a penetrating part 11a. The penetrating part 11a is formed to have a rectangular planar shape with the four corners rounded. The inner side surface of the penetrating part 11a forms a part of the sidewall of the cavity C. The inner side surfaces on both sides opposed to each other in a direction of the shorter side of the penetrating part 11a, there are respectively disposed mounting parts 14A, 14B protruding inward. The mounting parts 14A, 14B are formed at roughly the center in the longitudinal direction of the penetrating part 11a. The mounting parts 14A, 14B are formed to have a length equal to or longer than 1/3 of the length in the longitudinal direction of the penetrating part 11a.

The sealing ring 12 is an electrically-conductive frame-like member one size smaller than the outer shape of each of the first base substrate 10 and the second base substrate 11, and is bonded to the upper surface of the second base substrate 11. Specifically, the sealing ring 12 is bonded on the second base substrate 11 by baking with a brazing material such as silver solder, a soldering material, or the like, or bonded by fusion bonding to a metal bonding layer formed (by, e.g., evaporation or sputtering besides electrolytic plating or electroless plating) on the second base substrate 11.

As the material of the sealing ring 12, there can be cited, for example, a nickel base alloy, and specifically, it is sufficient to be selected from kovar, elinvar, invar, 42-alloy, and so on. In particular, as the material of the sealing ring 12, it is preferable to select a material closer in thermal expansion coefficient to the first base substrates 10 and the second base substrate 11 made of ceramic. For example, in the case of using alumina having the thermal expansion coefficient of $6.8 \times 10^{-6}/°C$. as the first base substrate 10 and the second base substrate 11, kovar having the thermal expansion coefficient of $5.2 \times 10^{-6}/°C$. or 42-alloy having the thermal expansion coefficient of 4.5 through $6.5 \times 10^{-6}/°C$. is preferably used as the sealing ring 12.

The sealing plate 4 is an electrically-conductive substrate overlapped with the sealing ring 12, and is airtightly bonded to the package main body 3 by bonding to the sealing ring 12. Further, the space defined by the sealing plate 4, the sealing ring 12, the penetrating part 11a of the second base substrate 11, and the upper surface of the first base substrate 10 functions as the cavity C airtightly sealed.

As the welding method of the sealing plate 4, there can be cited, for example, seam welding by making a roller electrode have contact, laser welding, and ultrasonic welding. Further, in order to make the welding between the sealing plate 4 and the sealing ring 12 more reliable, it is preferable to form a bonding layer of nickel, gold, or the like having an affinity with each other at least on the lower surface of the sealing plate 4 and the upper surface of the sealing ring 12.

Incidentally, on the upper surfaces of the mounting parts 14A, 14B of the second base substrate 11, there are formed a pair of electrode pads 20A, 20B, respectively, which are connection electrodes with the piezoelectric vibrator element 6. Further, on the lower surface of the first base substrate 10, a pair of external electrodes 21A, 21B are formed in the longitudinal direction of the package 2 with a space. The electrode pads 20A, 20B and the external electrodes 21A, 21B are each a single layer film made of single metal or a laminated film having different metals stacked one another formed by, for example, vapor deposition or sputtering.

The electrode pads 20A, 20B and the external electrodes 21A, 21B are electrically connected to each other via second through electrodes 22A, 22B provided to the mounting parts 14A, 14B of the second base substrate 11, connection electrodes 24A, 24B (not shown) formed between the first base substrate 10 and the second base substrate 11, and first through electrodes 23A, 23B (not shown) provided to the first base substrate 10, respectively.

Meanwhile, although the details will be described later, on the electrode pads 20A, 20B, there are disposed first bonding members 51a, 51b and second bonding members 52a, 52b separated in a first direction D1 from each other, and the support arm parts 9a, 9b are each bonded at two points separated in the longitudinal direction from each other.

Figure 3A:
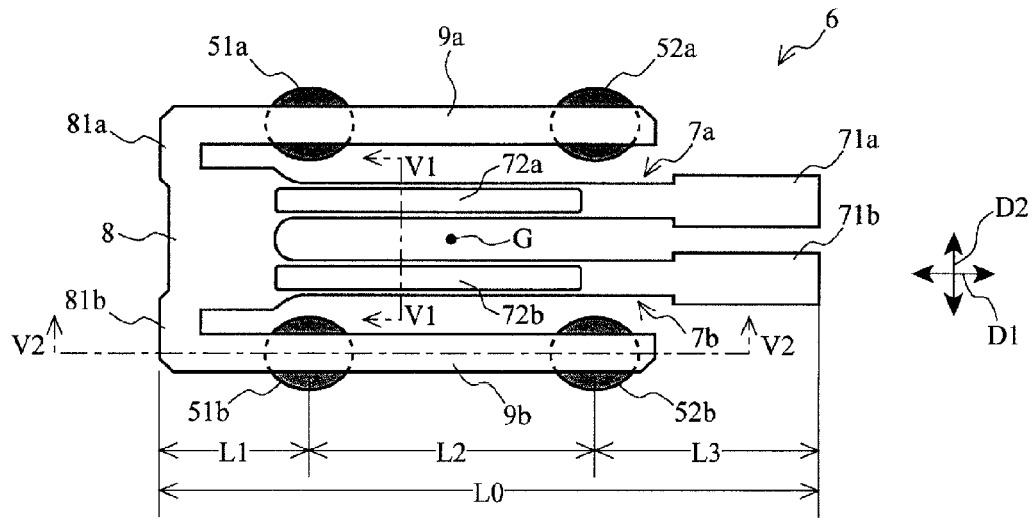
FIGS. 3A through 3C are diagrams showing a configuration of a piezoelectric vibrator element and a cross section of the piezoelectric vibrator.
Figure 3B:
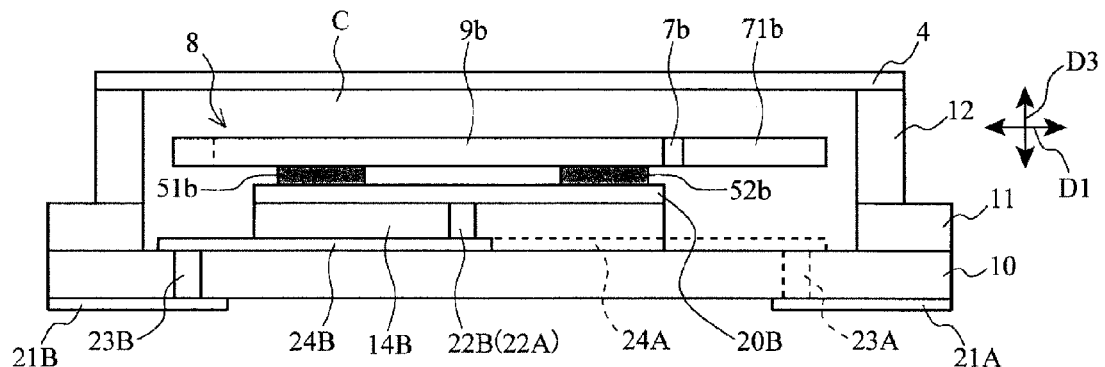
Figure 3C:
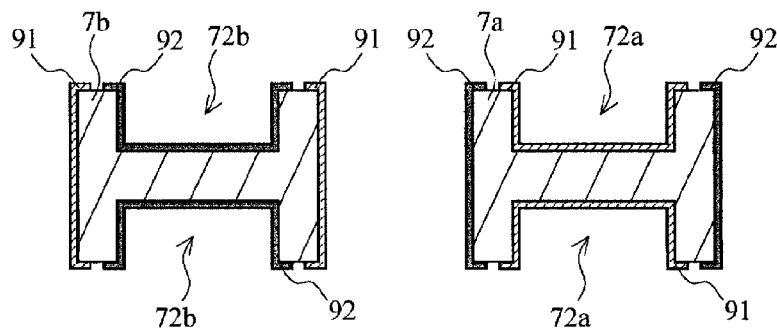
Figure 5A:
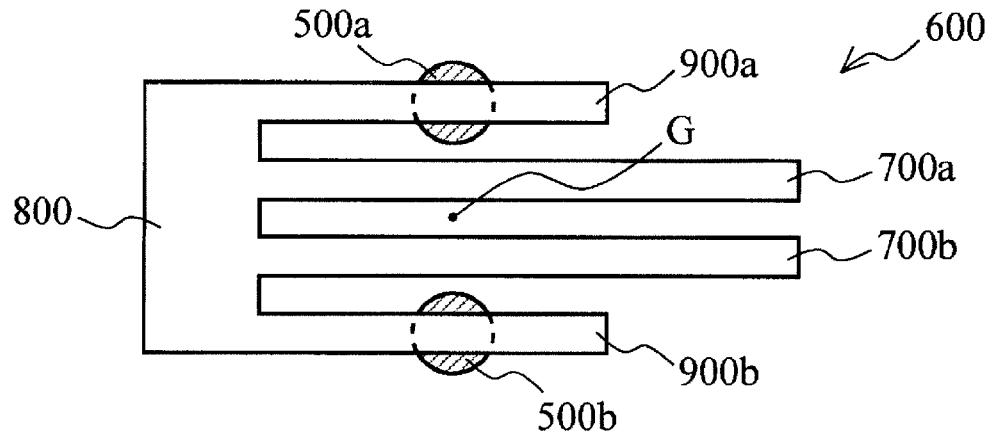
FIGS. 5A through 5F are explanatory diagrams showing the structure of the related-art piezoelectric vibrator element.
Figure 5B:
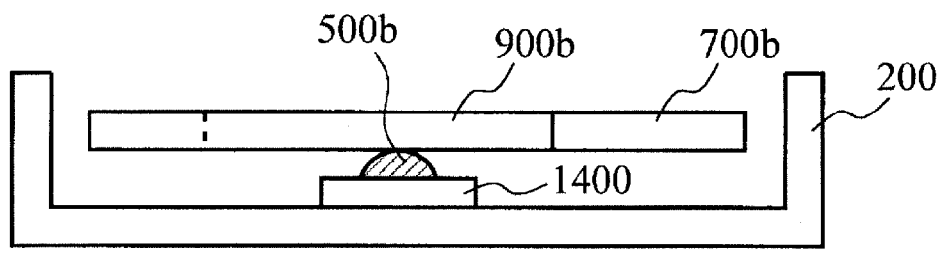
Figure 5C:
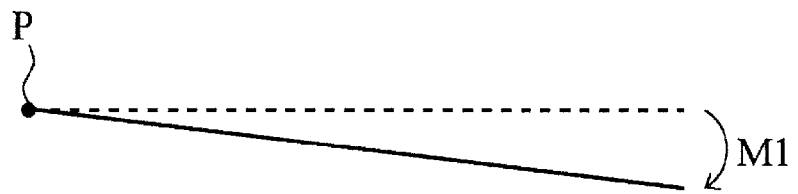
Figure 5D:
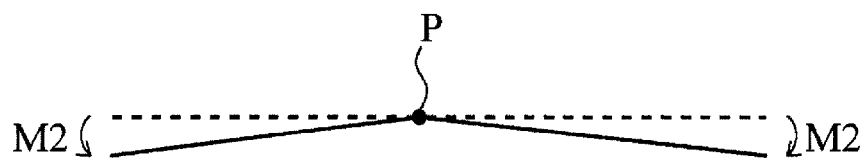
Figure 5E:
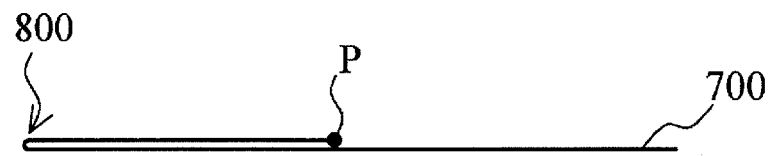
Figure 5F:
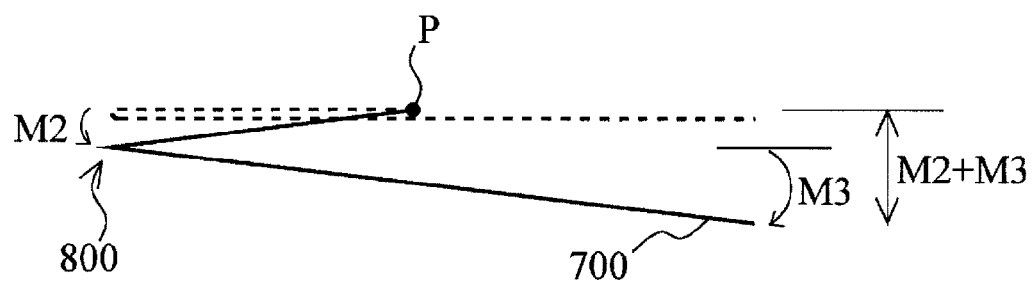

FIGS. 3A through 3C are diagrams showing a configuration of a piezoelectric vibrator element 6 according to the first embodiment, and a cross section of the piezoelectric vibrator.

Hereinafter, the explanation will be presented assuming the longitudinal direction of the piezoelectric vibrator 1 on a plane parallel to the first base substrate 10 as a first direction D1, a direction (the shorter-side direction of the piezoelectric vibrator 1) perpendicular to the first direction D1 on the same plane as a second direction D2, and a direction (the thickness direction of the piezoelectric vibrator 1) perpendicular to the first direction D1 and the second direction D2 as a third direction D3 as shown in FIGS. 3A through 3C (see also FIG. 1).

As shown in FIG. 3A, the piezoelectric vibrator element 6 is provided with the pair of vibrating arm parts 7a, 7b, the base 8, and the pair of support atm parts 9a, 9b.

The base 8 connects one end parts in the first direction D1 of the pair of vibrating arm parts 7a, 7b to each other.

To the base 8, there are connected connection parts 81a, 81b extending outward along the second direction D2 from the both end surfaces facing to the second direction D2, and to the connection parts 81a, 81b, there are connected the support arm parts 9a, 9b each extending along the first direction D1. The pair of support arm parts 9a, 9b are disposed on the both outer sides of the vibrating arm parts 7a, 7b in the second direction D2.

The vibrating arm parts 7a, 7b are formed so that the length from the end part on the base 8 side to the tip part is equal to or longer than ⅓ of the total length L0 of the piezoelectric vibrator element 6. The length is for ensuring the distance between the first bonding members 51a, 51b and the second bonding members 52a, 52b as described later.

The pair of vibrating arm parts 7a, 7b are disposed so as to be parallel to each other, and each vibrate with the end part on the base 8 side acting as the fixed end and the tip acting as the free end.

The pair of vibrating arm parts 7a, 7b are respectively provided with a widened parts 71a, 71b each formed to have a larger width than the width dimension on the base 8 side. The widened parts 71a, 71b have a function of increasing the weight and the moment of inertia during the vibration of the vibrating arm parts 7a, 7b, respectively. Thus, the vibrating atm parts 7a, 7b become easy to vibrate, and the length of each of the vibrating arm parts 7a, 7b can be shortened to achieve miniaturization.

It should be noted that although in the piezoelectric vibrator element 6 according to the present embodiment, the widened parts 71a, 71b are respectively provided to the vibrating arm parts 7a, 7b, it is also possible to use the piezoelectric vibrator element without the widened parts.

Further, in the piezoelectric vibrator 1 according to the present embodiment, although not shown in the drawings, the tip parts (the widened parts 71a, 71b) of the vibrating arm parts 7a, 7b are each provided with a weight metal film (formed of a coarse adjustment film and a fine adjustment film) for performing an adjustment (a frequency adjustment) of the vibration state so as to vibrate within a predetermined frequency range. By irradiating the weight metal film with, for example, a laser beam to remove the suitable amount of the weight metal film, it is possible to perform the frequency adjustment so that the frequency of the pair of vibrating arm parts 7a, 7b fit into the range of the normal frequency of the device. It is also possible not to form the weight metal film similarly to the widened part.

FIG. 3C is a cross-sectional view along the line V1-V1 shown in FIG. 3A viewed in the arrow direction.

As shown in FIGS. 3A and 3C, the pair of vibrating arm parts 7a, 7b are respectively provided with groove parts 72a, 72b each having a constant width. The groove parts 72a, 72b are recessed in the third direction D3 on both principal surfaces (obverse and reverse surfaces) of the pair of vibrating arm parts 7a, 7b, and at the same time, extend along the first direction D1 from the base 8 side. The groove parts 72a, 72b are formed in the areas extending from the base ends of the vibrating arm parts 7a, 7b to the widened parts 71a, 71b, respectively.

Due to the groove parts 72a, 72b, the pair of vibrating atm parts 7a, 7b each have an H-shaped cross-sectional shape as shown in FIG. 3C.

As shown in FIG. 3C, on the outer surfaces of the pair of vibrating arm parts 7a, 7b, there are respectively formed a pair of (two systems of) excitation electrodes 91, 92. Among these constituents, the pair of excitation electrodes 91, 92 are electrodes for vibrating the pair of vibrating arm parts 7a, 7b in the direction of getting closer to or away from each other at a predetermined resonance frequency when a voltage is applied, and are formed on the vibrating arm parts 7a, 7b by patterning in an electrically separated state.

Specifically, one excitation electrode 91 is mainly formed in the grooves 72a of one vibrating arm part 7a and on the side surfaces of the other vibrating arm part 7b in the state of being electrically connected to each other.

Further, the other excitation electrode 92 is mainly formed in the grooves 72b of the other vibrating arm part 7b and on the side surfaces of the one vibrating arm part 7a in the state of being electrically connected to each other.

Although not shown in the drawings, on the surface of the piezoelectric vibrator element 6 opposed to the first base substrate 10, two systems of mounting electrodes are formed in the support arm parts 9a, 9b as mount parts used when mounting the piezoelectric vibrator element 6 on the package 2, and two systems of wiring electrodes electrically connected to the respective mounting electrodes are provided to the connection parts 81a, 81b and the base 8.

Further, the mounting electrode of a first system provided to the support arm part 9a is connected to the excitation electrode 92 (see FIG. 3C) via the wiring electrode, and the mounting electrode of a second system provided to the support arm part 9b is connected to the excitation electrode 91 via the wiring electrode.

It is arranged that a voltage is applied to the two systems of excitation electrodes 91, 92 via a pair of mounting electrodes.

It should be noted that the excitation electrodes 91, 92, the mounting electrodes, and the wiring electrodes are each a laminated film of, for example, chromium (Cr) and gold (Au), and are each formed by depositing a chromium film having good adhesiveness with a quartz crystal as a foundation layer, and then providing a gold thin film on the surface of the chromium film. It should be noted that the case is not a limitation, and it is also possible to, for example, further stack a gold thin film on the surface of the laminated film formed of chromium and Nichrome (NiCr), or adopt a single layer film of chromium, nickel, aluminum (Al), titanium (Ti), or the like.

FIG. 3B is a cross-sectional view along the first direction D1 of the piezoelectric vibrator 1 having the piezoelectric vibrator element 6 mounted on the package 2 shown in FIG. 1, and is a cross-sectional view along the line V2-V2 shown in FIG. 3A viewed in the arrow direction. It should be noted that in order to show the second through electrode 23B, the cross-sectional position in that part is shifted.

On the mounting surfaces (the surface opposed to the sealing plate 4) of the mounting parts 14A, 14B of the second base substrate 11, there are formed the electrode pads 20A, 20B, respectively, throughout the roughly entire surfaces.

On the other hand, on the outer bottom surface of the first base substrate 10, the external electrodes 21A, 21B extending in the shorter-side direction (the second direction D2) are formed on the both end sides in the longitudinal direction (the first direction D1).

The electrode pads 20A, 20B and the external electrodes 21A, 21B are each a single layer film made of single metal or a laminated film having different metals stacked on one another formed by vapor deposition or sputtering, and the electrode pad 20A and the external electrode 21A are electrically connected to each other, and the electrode pad 20B and the external electrode 21B are electrically connected to each other.

Specifically, as shown in FIG. 3B, the first base substrate 10 is provided with the first through electrode 23B electrically connected to the external electrode 21B, and penetrating the first base substrate 10 in the thickness direction. Further, at roughly the center of the mounting part 14B of the second base substrate 11 (see FIG. 2), there is formed the second through electrode 22B electrically connected to the electrode pad 20B, and penetrating the mounting part 14B in the thickness direction. Further, between the first base substrate 10 and the second base substrate 11 (the mounting part 14B), there is formed the connection electrode 24B for connecting the first through electrode 23B and the second through electrode 22B to each other.

As described above, the electrode pad 20B and the external electrode 21B are electrically connected to each other via the second through electrode 22B, the connection electrode 24B, and the first through electrode 23B.

On the other hand, as indicated by dotted lines in FIG. 3B, the first base electrode 10 is provided with the first through electrode 23A electrically connected to the external electrode 21A, and penetrating the first base substrate 10 in the thickness direction, and at roughly the center of the mounting part 14A of the second base substrate 11, there is formed the second through electrode 22A electrically connected to the electrode pad 20A, and penetrating the mounting part 14A in the thickness direction. Further, between the first base substrate 10 and the second base substrate 11 (the mounting part 14A), there is formed the connection electrode 24A for connecting the first through electrode 23A and the second through electrode 22A to each other.

As described above, the electrode pad 20A and the external electrode 21A are electrically connected to each other via the second through electrode 22A, the connection electrode 24A, and the first through electrode 23A.

It should be noted that the both connection electrodes 24A, 24B do not have shapes for linearly connecting the first through electrodes 23A, 23B and the second through electrodes 22A, 22B to each other, respectively, but are formed along the area where the second base substrate 11 and the first base substrate 10 have contact with each other in order to avoid exposure in the cavity C.

The piezoelectric vibrator element 6 is housed in the cavity C of the package 2 airtightly sealed in the state of being mounted on the mounting parts 14A, 14B with the pair of support arm parts 9a, 9b.

Specifically, as shown in FIGS. 3A and 3B, in the piezoelectric vibrator element 6, the mounting electrodes provided to the support arm parts 9a, 9b are electrically and mechanically bonded to the electrode pads 20A, 20B (on metalization layers in the case in which the metalization layers are formed on the upper surface) on the mounting parts 14A, 14B via the first bonding members 51a, 51b and the second bonding members 52a, 52b.

As described above, in the piezoelectric vibrator element 6 according to the present embodiment, each of the support arm parts 9a, 9b is bonded and held on the corresponding one of the mounting parts 14A, 14B at the two regions arranged in the length direction (the first direction D1) (two-point supporting).

As the first bonding members 51a, 51b and the second bonding members 52a, 52b, a material having electrical conductivity, and having fluidity in the initial stage of the bonding process, and then solidified to develop the bonding strength in the later stage of the bonding process is used, and for example, an electrically-conductive adhesive such as a silver paste, and metal bumps are preferably used.

In the case in which the first bonding members 51a, 51b and the second bonding members 52a, 52b are each formed of an electrically-conductive adhesive, the electrically-conductive adhesive is applied by a dispenser nozzle supported by a moving head of a coating device.

In the present embodiment, although the size of each of the bonding members depends on the size of the piezoelectric vibrator 1, in the case of, for example, the piezoelectric vibrator 1 with a size of 1.2 mm×1.0 mm, the bonding member is applied so as to have a radius of about 0.1 mm.

Then, an arrangement relationship between the first bonding members 51a, 51b and the second bonding members 52a, 52b for fixedly holding the support arm parts 9a, 9b on the mounting parts 14A, 14B will be described.

It should be noted that since the piezoelectric vibrator 1 according to the present embodiment has a structure symmetrical in the second direction D2, in the description, the both parts symmetrically disposed are denoted by the same numeric characters, and in order to distinguish the both parts from each other, discriminators a, A are attached to one of the parts and discriminators b, B are attached to the other of the parts in such a manner as the vibrating arm part 7a and the vibrating arm 7b. In the following description, the discriminators are omitted, and the discriminators are attached in the case of distinguishing the both parts from each other.

As shown in FIG. 3A, the distance from the end part of the piezoelectric vibrator element 6 located on the base 8 side to the center of the first bonding member 51 is defined as the distance between the centers of the first bonding member 51 and the second bonding member 52 are defined as L2, the distance from the center of the second bonding member 52 to the tip of the vibrating arm part 7 is defined as L3, and the total length of the piezoelectric vibrator element 6 is defined as L0 (=L1+L2+L3).

(A) As shown in FIG. 3A, in the support arm part 9 of the present embodiment, the first bonding member 51 and the second bonding member 52 are disposed so as to be separated from each other in the length direction of the support arm section 9.

By providing the two bonding regions between the support arm part 9 and the electrode pad 20 on the mounting part 14, namely the first bonding member 51 and the second bonding member 52, separated from each other, a favorable balance is achieved when mounting the piezoelectric vibrator element 6 on the both bonding members 51, 52 applied, and thus, the tilt amount of the piezoelectric vibrator element 6 can be reduced compared to the related art having a single bonding region. In particular, in the case of using the electrically-conductive adhesive as the bonding members, since the piezoelectric vibrator element 6 is mounted after applying the electrically-conductive adhesive and before solidifying the electrically-conductive adhesive, it is particularly effective for the reduction of the tilt amount that the piezoelectric vibrator element 6 can be mounted in a balanced manner, and thus, the mounting accuracy is improved to achieve an increase in production yield and an improvement in the characteristics.

Further, by bonding with two members, namely the first bonding member 51 and the second bonding member 52, it is possible to more firmly bond the piezoelectric vibrator element 6.

More specifically, in the case of bonding the piezoelectric vibrator element at a single point, when the piezoelectric vibrator element 6 is displaced due to an external force such as an impact, similar to a seesaw, it results that the both sides pivoted on the bonding point are displaced, and since the stress is applied to both sides of the bonding point, there is a possibility that the bonding region is damaged.

In contrast, in the present embodiment, although the base 8 side is displaced with respect to the external force with the first bonding member 51 acting as a base point, the opposite side is fixed by the second bonding member 52, and is therefore not significantly displaced.

As described above, since in the present embodiment, the stress is applied only to base 8 side of the first bonding member 51, but is not applied to the opposite side, it is possible to reduce the possibility of being damaged in the first bonding member 51. Even in the case in which the first bonding member 51 is damaged, since the bonding is maintained by the second bonding member 52, the electrical connection with the external electrode 21 is ensured, and the performance as the product can be maintained.

Further, since the first bonding member 51 and the second bonding member 52 for bonding the support arm part 9 of the present embodiment are disposed so as to be separated from each other, the amount of the bonding material used can be reduced compared to the case of applying the bonding material on the entire support arm part 9. Further, by reducing the amount of the bonding material used, it becomes possible to reduce the amount of the gas generated in the cavity C.

It should be noted that although in the present embodiment, there are disposed the two bonding regions of the support arm part 9 with the bonding members, the number of the bonding regions is not limited to two, but three or more bonding regions can also be adopted providing the bonding regions are disposed in the state of being separated from each other. It should be noted that in order to achieve the stability in mounting the piezoelectric vibrator element 6, and to minimize the generation of the gas in the cavity C, the two bonding regions are preferable.

(B) Further, in the support arm part 9 of the present embodiment, the first bonding member 51 to be located on the base 8 side is disposed on the base 8 side of the imaginary centroidal line passing through the centroid G of the piezoelectric vibrator element 6 and extending in the shorter-side direction of the piezoelectric vibrator element 6 (the second direction D2).

Therefore, compared to the related art in which the bonding is achieved at the single point on the imaginary centroidal line, the length of a path from the first bonding member 51 to the tip of the vibrating arm part 7 via the base 8 is decreased, it becomes possible to reduce the total displacement in the case in which an external force is applied to the piezoelectric vibrator 1, and it is possible to reduce the possibility that the tip of the vibrating arm part 7 collides with the inside of the package to be damaged. Further, since the displacement of the piezoelectric vibrator 1 is decreased, it is also possible to reduce the thickness.

(C) On the other hand, in addition to (B) described above, the second bonding member 52 of the present embodiment is disposed on the tip side of the support arm part 9 from the imaginary centroidal line.

Thus, it results that the imaginary centroidal line exists between the first bonding member 51 and the second bonding member 52, and the piezoelectric vibrator element 6 can be disposed in a balanced manner.

It should be noted that although it is preferable for the second bonding member 52 to be disposed on the tip side from the imaginary centroidal line, it is also possible for the second bonding member 52 to be located on the base 8 side of the centroid. In this case, although the imaginary centroidal line becomes to fail to exist between the first bonding member 51 and the second bonding member 52, the tilt of the piezoelectric vibrator element 6 can be reduced compared to the case of achieving the bonding with the single bonding region of the first bonding member 51.

(D) On the other hand, the first bonding member 51 for bonding the support arm part 9 of the present embodiment is disposed on the imaginary centroidal line side of the connection part 81 for connecting the base 8 and the support arm part 9 to each other.

Therefore, compared to the related art not provided with the support arm part, and bonding (cantilevering) the piezoelectric vibrator element at the end part of the base, it is possible to reduce the vibration leakage from the vibrating arm part 7 for supporting and bonding the piezoelectric vibrator element 6.

(E) As described above, the vibrating arm part 7 is formed so that the length from the end part on the base 8 side to the tip part is longer than ⅓ of the total length L0 of the piezoelectric vibrator element 6. This is for ensuring the distance between the first bonding members 51a, 51b and the second bonding members 52a, 52b.

Further, the first bonding member 51 and the second bonding member 52 for bonding the support arm part 9 are disposed in the vicinities of the points dividing the total length L0 of the piezoelectric vibrator element 6 into three equal parts. In this case, it is preferable to satisfy L1<L3<L2 with the proportion of L2 to L0 included in a range of 45% through 35%. The condition of L1<L2 is for increasing the effect of (B) described above.

In the piezoelectric vibrator element 6 according to the present embodiment, by setting the distance L2 between the first bonding member 51 and the second bonding member 52 so as to fulfill the condition of L2>L0/3, it is possible to absorb or disperse the external force applied or the vibration of the vibrating arm part 7 by slightly distorting the support arm part 9 existing between the first bonding member 51 and the second bonding member 52, and it becomes possible to suppress an influence from the outside and an influence to the outside.

FIG. 4 is a diagram showing ratios between the total length L0 and the sizes of L1, L2, and L3 as practical examples of the piezoelectric vibrator element 6. It should be noted that the total amount fails to match up in the numerical values shown in FIG. 4 because of rounding off.

As shown in FIG. 4, the sizes of the piezoelectric vibrator element 6 in the practical examples (1) through (3) are the total length L0=1.38 mm×the width 0.556 mm, the total length L0=1.1 mm×the width 0.48 mm, and the total length L0=0.907 mm×the width 0.505 mm, respectively.

Further, the sizes of the piezoelectric vibrator 1 to which the piezoelectric vibrator element 6 is mounted in the practical examples (1) through (3) are the length 2.05 mm×the width 1.25 mm in the practical example (1), the length 1.65 mm×the width 1.05 mm in the practical example (2), and the length 1.25 mm×the width 1.05 mm in the practical example (3), respectively.

The values of L1 through L3, and the ratios L1/L0, L2/L0, and L3/L0(%) to the total length L0 in each of the piezoelectric vibrator elements 6 are as shown in FIG. 4.

In either of the practical examples, the support arm part 9 is bonded to the mounting part 14 with the two bonding regions, namely the first bonding member 51 and the second bonding member 52, the first bonding member 51 is located on the base 8 side of the imaginary centroidal line, and is located on the imaginary centroidal line side of the connection part 81, and the second bonding member 52 is located on the tip side of the imaginary centroidal line, and the distance L2 between the first bending member 51 and the second bonding member 52 is equal to or longer than ⅓ of the total length L0.

According to each of the practical examples (1) through (3), the advantages described in (A) through (E) can be obtained.

In the case of operating the piezoelectric vibrator 1 configured in such a manner, a predetermined voltage is applied to the external electrodes 21A, 21B. When the predetermined voltage is applied to the external electrodes 21A, 21B, a current flows through the two systems of excitation electrodes 91, 92, and the pair of vibrating arm parts 7a, 7b vibrate at a predetermined resonance frequency in a direction (the second direction D2) of, for example, getting closer to and away from each other due to the inverse piezoelectric effect caused by the electric field generated between the two systems of excitation electrodes 91, 92. The vibration of the pair of vibrating arm parts 7a, 7b is used as the time source, the timing source of a control signal, the reference signal source, and so on.

The piezoelectric vibrator 1 described hereinabove is used in a wave clock, a cellular phone, or a portable information terminal device as a timing source, a reference signal source, and so on of a clock source, a control signal, and so on, or used for a measurement device such as a gyro sensor, and so on.

The invention is not limited to the above embodiment described with reference to the drawings, but a variety of modified examples can be cited within the scope or the spirit of the invention.

For example, although in the embodiment described above, the surface mounted vibrator of the ceramic package type is described as the piezoelectric vibrator using the piezoelectric vibrator element, the piezoelectric vibrator element can also be applied to a piezoelectric vibrator of a glass package type having a base substrate and a lid substrate formed of a glass material bonded by anodic bonding.

Further, although the electrode pad 20 in the embodiment described above is formed on roughly the entire surface of the mounting part 14, it is sufficient for the electrode pad to be formed in a region corresponding to at least one of the first bonding member 51 and the second bonding member 52. In this case, the second through electrode 23 (see FIG. 3B) is formed at a place of the mounting part 14 corresponding to the electrode pad 20.

Besides the above, it is arbitrarily possible to replace the constituent in the embodiment described above with a known constituent within the scope or the spirit of the invention.

What is claimed is:

1. A piezoelectric vibrator comprising:
    a vibrating element extensive in a plane defined by a first direction (D1) and a second direction (D2) intersecting the first direction (D1), the vibrating element comprising a base, a pair of vibrating arms extending from the base in the first direction (D1) and a pair of supporting arms extending from the base in the first direction (D1), the pair of vibrating arms being situated between the supporting arms in the second direction (D2);
    a package comprising a base and a pair of mounts on which the pair of supporting arms are mounted, respectively;
    an electrode pad on a mount surface of each of the pair of mounts;
    a through electrode through each of the pair of mounts and in connection with the electrode pad; and
    first and second bonding members at different locations in the first direction (D1) on each of the pair of mounts and configured to bond a respective supporting arm to the electrode pad of a corresponding mount at the different locations in the first direction (D1),
    wherein the first bonding member is between the base and a line extending in the second direction (D2) through a gravity center of the vibrating element,
    the different locations of the first and second bonding members satisfy the conditions:
        (i) a length L2 is about 45% to about 35% of a length L0; and
        (ii) the length L2 is longer than a length L1,
        where the length L1 is in the first direction (D1) between a proximal end of the base and a center of the first bonding member, the length L2 is in the first direction (D1) between the center of the first bonding member and a center of the second bonding member, and the length L0 is an entire length of the vibrating element in the first direction (D1), and
    a respective through electrode is between the first and second bonding members without overlapping the first and second bonding members.

2. The piezoelectric vibrator according to claim 1, wherein the different locations of the first and second bonding members further satisfy a condition of the length L1<a length L3<the length L2, where the length L3 represents a length in the first direction (D1) between the center of the second bonding member and a distal end of the vibrating arms.

3. The piezoelectric vibrator according to claim 1, wherein the second bonding member is in a distal end portion of a respective supporting arm.

4. The piezoelectric vibrator according to claim 1, wherein the first bonding member is between a proximal end of a respective supporting arm that connects the supporting arm to the base and the line extending in the second direction (D2) through the gravity center of the vibrating element.

5. The piezoelectric vibrator according to claim 1, wherein the second member is between a distal end of a respective supporting arm and the line extending in the second direction (D2) through the gravity center of the vibrating element.

6. The piezoelectric vibrator according to claim 1, wherein the vibrating element has a dimension of 1.2 mm ×1.0 mm, and the first and second bonding members have a diameter of 0.1 mm.

7. The piezoelectric vibrator according to claim 1, wherein the first bonding member is between the base and the line extending in the second direction (D2) through the gravity center of the vibrating element.

8. The piezoelectric vibrator according to claim 1, wherein the length L3 is larger than the length L0/3.

* * * * *